(12) United States Patent
Murphy et al.

(10) Patent No.: US 8,749,248 B2
(45) Date of Patent: Jun. 10, 2014

(54) SHIELDING FLAW DETECTION AND MEASUREMENT IN QUADRATURE AMPLITUDE MODULATED CABLE TELECOMMUNICATIONS ENVIRONMENT

(75) Inventors: John J. Murphy, Mt. Crawford, VA (US); Dennis A. Zimmerman, Bridgewater, VA (US)

(73) Assignee: ConSonics, Inc., Harrisonburg, VA (US)

( * ) Notice: Subject to any disclaimer, the term of this patent is extended or adjusted under 35 U.S.C. 154(b) by 512 days.

(21) Appl. No.: 13/080,715

(22) Filed: Apr. 6, 2011

(65) Prior Publication Data

US 2012/0257661 A1 Oct. 11, 2012

(51) Int. Cl.
 *G01R 31/28* (2006.01)
 *H04L 1/20* (2006.01)

(52) U.S. Cl.
 USPC ............................ 324/528; 324/527; 375/224

(58) Field of Classification Search
 CPC ....... H04B 17/00; G01R 31/021; H01L 43/50
 USPC ........................................................ 324/528
 See application file for complete search history.

(56) References Cited

U.S. PATENT DOCUMENTS

| 4,072,899 | A | 2/1978 | Shimp |
| 5,294,937 | A | 3/1994 | Ostteen et al. |
| 5,978,449 | A | 11/1999 | Needle |
| 6,600,515 | B2 * | 7/2003 | Bowyer et al. ................. 348/461 |
| 2008/0224712 | A1 | 9/2008 | Peyton et al. |
| 2011/0043640 | A1 * | 2/2011 | Zinevich ....................... 348/192 |
| 2011/0267474 | A1 | 11/2011 | Sala et al. |

FOREIGN PATENT DOCUMENTS

| JP | 07-240264 | 9/1995 |
| JP | 2006-029801 | 2/2006 |
| KR | 10-1021676 | 3/2011 |

* cited by examiner

*Primary Examiner* — Melissa Koval
*Assistant Examiner* — Courtney McDonnough
(74) *Attorney, Agent, or Firm* — Whitham, Curtis, Christofferson & Cook, P.C.

(57) ABSTRACT

Signal egress from a shielding flaw in a cable telecommunication system is detected, even where signals carried by the cable telecommunication system are quadrature amplitude modulated signals that statistically resemble broadband noise by generating a marker signal comprising a double side band, suppressed carrier signal in the fringes of contiguous frequency bands and at a power level which cannot cause perceptible interference with signals in those contiguous frequency bands. The separation of the sidebands comprising the marker signal can unambiguously identify the marker signal and can distinguish between different cable telecommunication systems installed in the same geographic area. The marker signal can be additionally coded by varying the frequency and/or amplitude of the modulating signal used to create the marker signal.

16 Claims, 4 Drawing Sheets

SHIELDING FLAW DETECTION AND MEASUREMENT IN QUADRATURE AMPLITUDE MODULATED CABLE TELECOMMUNICATIONS ENVIRONMENT

FIELD OF THE INVENTION

The present invention generally relates to maintenance of cable telecommunication systems and, more particularly, to detection of cable shielding flaws and measurement of signal egress in such systems in which the communicated signal is quadrature amplitude modulated (QAM).

BACKGROUND OF THE INVENTION

Cable telecommunications systems have been known for a number of years and are currently gaining in popularity and coverage for the distribution of television programming, telephone service and networking of computers such as providing Internet access since they can carry many signals over a wide bandwidth with little, if any interference or distortion, particularly as data transmission rates have increased to accommodate high definition television, increased volume of digital communication and the like. By the same token, since these communications are intended to be confined within the cable system, the increased bandwidth required for such communications need not be allocated from the available bandwidth for other communications such as radio, navigation, GPS, emergency communications and the like which must be transmitted as electromagnetic waves through the environment. However, flaws in cable shielding in cable telecommunication systems can allow signal egress which can potentially interfere with broadcast communications and potentially cause hazards. Reciprocally, flaws in cable shielding can permit signal ingress into the cable from the environment and degrade or interfere with the signal being carried by the cable telecommunication system. Therefore, such flaws must be quickly discovered and remedied as they occur due to weather, mechanical damage or the like.

Detection of cable shielding flaws is generally achieved through detection of the signal carried by the cable transmission system that has leaked into the environment, essentially by being broadcast from the shielding flaw. Detection of a signal that has leaked or egressed from a cable flaw is generally performed in two stages: first, by a receiver in a mobile vehicle driven in the general vicinity of installed cables that associates a received signal with a location of the mobile vehicle using a global positioning system (GPS) receiver which thus reports a general location of a shielding flaw and, second, by a hand-held instrument that can allow repair personnel to follow increasing signal strength to the exact location of the shielding flaw so that repairs and/or maintenance can be carried out.

Of course, such detections must be carried out in an environment in which noise as well as broadcast signals will also be present in the same frequency bands. Accordingly, a problem with all such systems is to identify a received signal as one originating in the cable telecommunications system and numerous techniques have been developed to effectively verify or authenticate a detected signal. An additional issue that follows from this problem is that a signal which is unique to the cable telecommunication system and distinguishable from broadband noise (e.g. a marker signal) necessarily consumes a finite amount of bandwidth and/or has the potential for interfering with the signal carried by the cable telecommunication system.

An exemplary system seeking to provide a solution to these related issues is disclosed in U.S. Pat. No. 4,072,899, issued Feb. 7, 1978, to Richard L. Shimp, which is hereby fully incorporated by reference. In the system disclosed therein, a variable frequency (e.g. "warbled") audio tone is added as a marker signal to the signal carried by the telecommunication system which can be easily detected by a narrow band portable receiver such that the audio tone can be perceived and followed by maintenance personnel while being easily filtered from or having little effect on the other signals carried by the cable telecommunication system.

However, at the present time, the need to carry ever greater amounts of information (e.g. for high definition television (HDTV) and the like) has resulted in the choice of complex modulation schemes such as quadrature amplitude modulation (QAM) to multiplex signals which are, themselves, more complex and have increased data content. (in general, a plurality of QAM multiplexers (often referred to as QAM generators are used, each carrying a small number of channels of information, and their outputs are combined by allocating contiguous spectral bands to each QAM multiplexer. The output of a QAM multiplexer or a plurality thereof is often statistically indistinguishable from ambient noise in the environment in which detection must be performed.

Accordingly, currently known techniques of signal egress detection have required the allocation of significant bandwidth (e.g. the equivalent of a band corresponding to a QAM multiplexer or at least the bandwidth corresponding to a television program channel) in order to provide a sufficiently complex signal for detection and identification without causing interference with other information carried by the cable telecommunication system. Allocation of such bandwidth has also been essential to measurement of the strength of signal egress allowing repairs to be prioritized and to assure compliance with regulations governing the operation of cable telecommunication systems.

Such an allocation of bandwidth thus reduces the otherwise available bandwidth of the cable telecommunication system and is essentially a large fixed cost of operating the system. Even with the allocation of economically significant bandwidth to the shielding flaw detection function, detection is not robust and, where two or more cable telecommunication systems may be present in the same geographic area, identification of the system having the shielding flaw can often not be performed unless the marker signal is particularly complex; requiring more than minimal bandwidth allocation.

SUMMARY OF THE INVENTION

It is therefore an object of the present invention to provide a cable shielding flaw detection and measurement system which uses a marker signal that cannot interfere with signals carried by a cable telecommunication system and which does not require allocation of bandwidth to the shielding flaw detection function.

It is another object of the present invention to provide robust detection of shielding flaws in combination with a robust and unambiguous identification of the cable telecommunication system from which the egress signal emanates.

In order to accomplish these and other objects of the invention, a method for detection and measurement of the severity of shielding flaws in a cable telecommunication system is provided comprising generating a marker carrier signal at a frequency at or between the boundaries of two consecutively located frequency bands allocated, respectively, to two sources of data to be distributed by the cable telecommunication system, modulating the marker carrier signal to produce two sideband signals as a marker signal, monitoring power of the frequency bans allocated to the two sources of data and regulating power of the marker signal in accordance therewith, combining the marker signal with signals in the two consecutively located frequency bands to form a combined signal, transmitting the combined signal through the cable telecommunication system, receiving a signal through an antenna, and detecting the marker signal in the signal received through the antenna.

In accordance with another aspect of the invention, a marker signal source is provided comprising a source of a carrier frequency signal, a source of a modulation signal, a modulator for modulating the carrier frequency signal with the modulation signal to provide the marker signal, means for monitoring power in a signal band of a signal with which the marker signal is to be combined, a comparator for comparing marker signal power with the power in a signal band of a signal with which the marker signal is to be combined, and means for controlling power of the marker signal.

In accordance with a further object of the inventions, a marker signal receiver is provided comprising a filter or tuner tuned to a center frequency of a marker signal, a spectrum analyzer for determining spectral content of an output of the filter or tuner, and a comparator for comparing a spectrum of an output of the spectrum analyzer with a spectral content of the marker signal.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
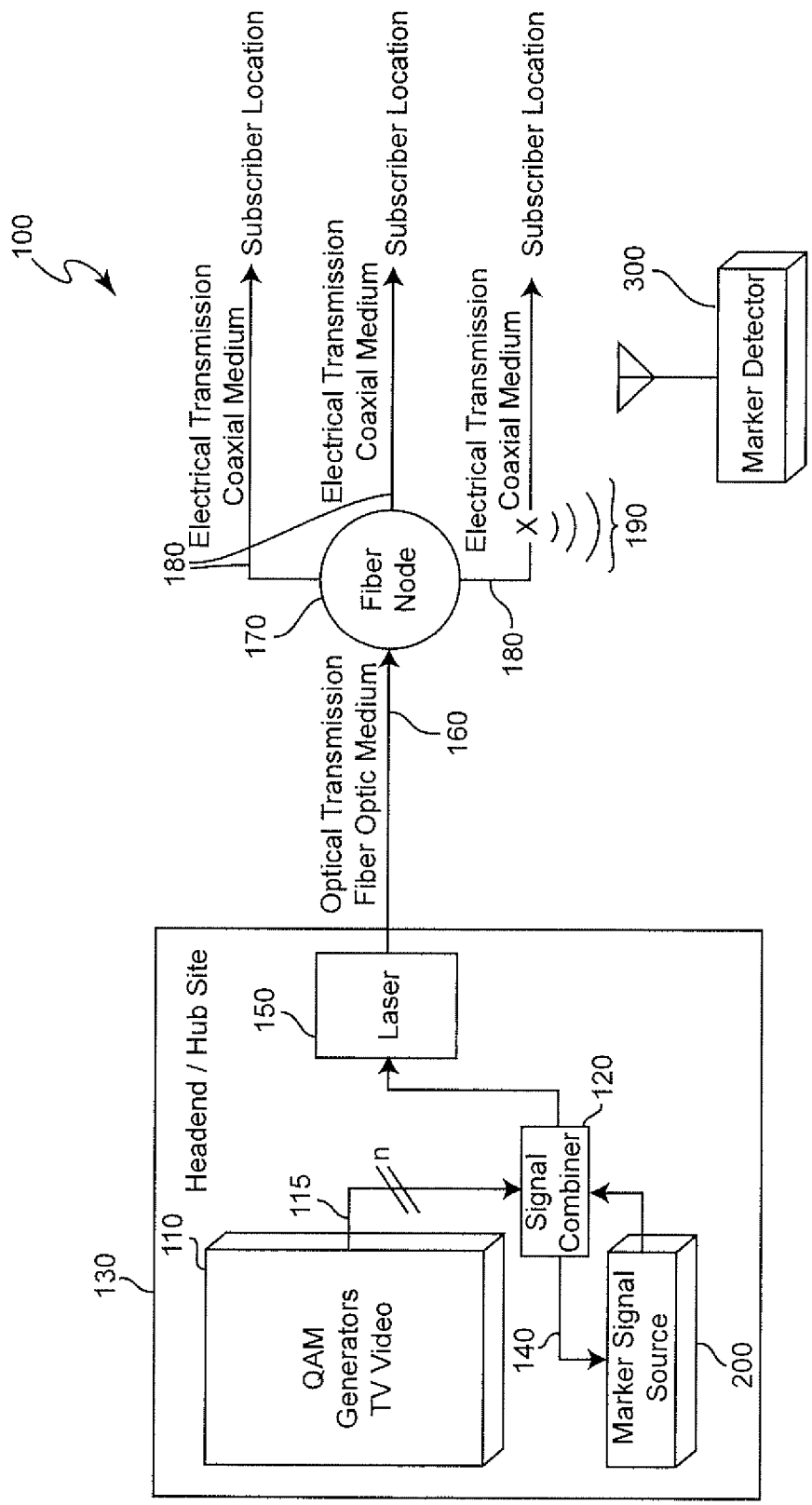
FIG. 1A is an overall high-level block diagram of the Shielding flaw and detection system in accordance with the invention.
Figure 1B:
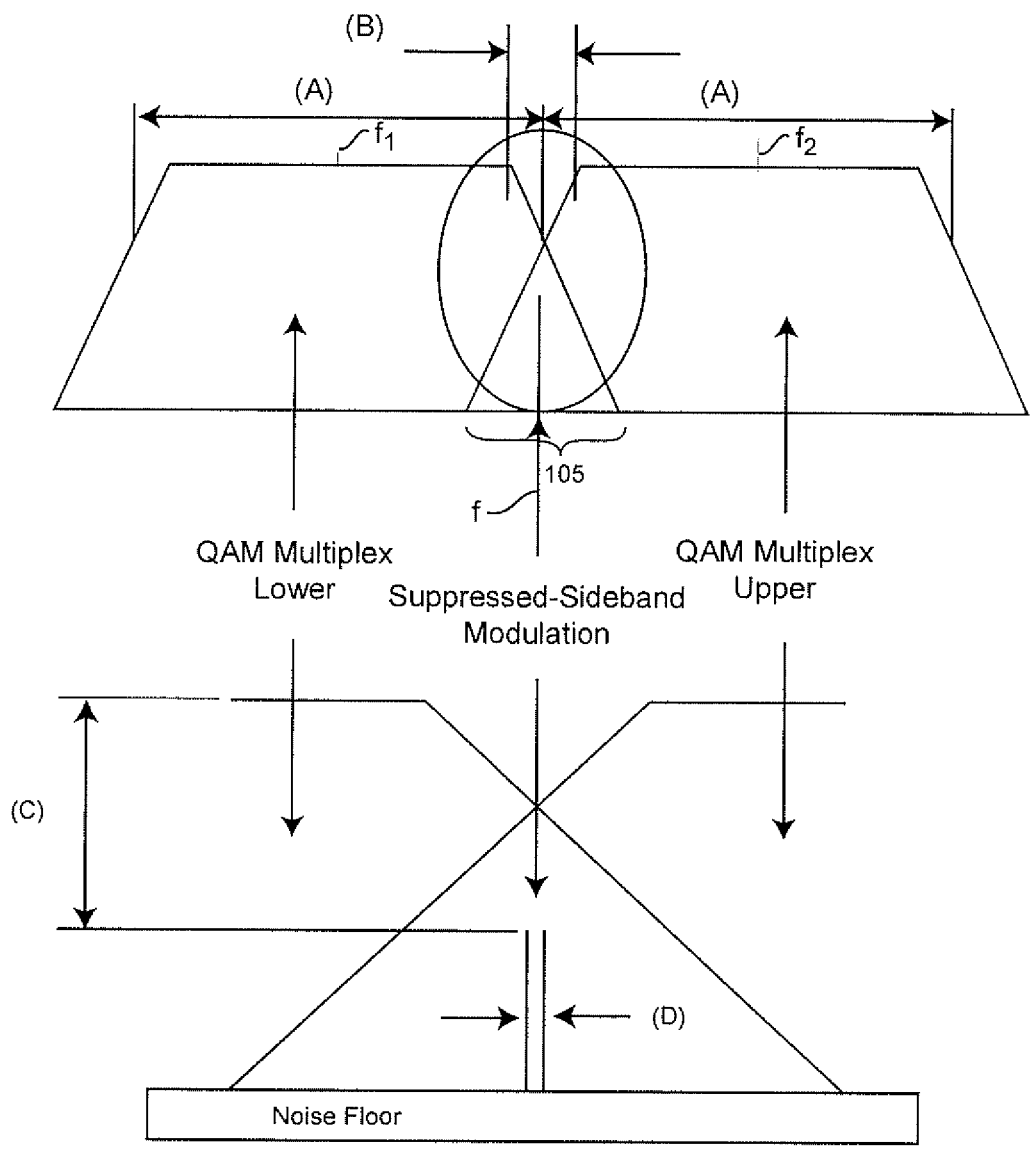
FIG. 1B is a diagram of a portion of the spectrum in which the invention is employed that is useful in understanding the operation of the invention.

Referring now to the drawings, and more particularly to FIG. 1A, there is shown a high-level block diagram of the overall cable telecommunication system 100 in accordance with the present invention. It should be appreciated that the block diagram of FIG. 1 can also be understood as a flow chart depicting the methodology of the invention or a data flow diagram. It should also be appreciated that the depiction of the telecommunication system 100 shown in FIG. 1A reflects current technology in the constitution of the telecommunication system as well as integration of the invention into that environment and thus no portion of the drawings is admitted to be prior art in regard to the present invention. However, it should be understood that the invention can be practiced with legacy (e.g. analog) cable telecommunication systems as well as all-digital and other systems which may be developed or foreseen. The application to systems including some or all of the data input from QAM generators/multiplexes (so denominated since they generate a quadrature amplitude modulated signal and provide quadrature amplitude modulation for signals which are generally multiplexed, although no multiplexing of signals is preformed in the QAM itself) is simply a particularly challenging environment for shielding flaw detection and measurement in which the invention provides particularly meritorious effects.

The system 100, as illustrated in FIG. 1A comprises a plurality of sources 110 of input information. The types of information inputs are not particularly important to the practice of the invention in accordance with its basic principles but, at the current time, the plurality of sources may be constituted by a plurality of QAM multiplexes/generators each receiving digital inputs from a plurality of sources. The number of sources that can be accommodated largely depends on the data rate of the input from each source which is often digital but analog signal sources can also be accommodated. The outputs of the QAM multiplexes are multi-level signals that are, essentially, a highly complex analog waveform and thus often statistically resembles noise. Thus, the QAM multiplexes may be regarded as not only multiplexed signal sources but digital to analog converters, as well. It should be appreciated, however, in regard to the operation of the invention, the QAM multiplexes need not provide any multiplexing function and should also be regarded as merely exemplary of data sources providing that data as a modulated signal (not limited to QAM) in a signal over a predetermined frequency band within the spectrum of the cable telecommunication system. The nominal spectra of two adjacent QAM bands are illustrated at A of FIG. 1B.

The signal combiner 120 may be any commercially available unit equipped with a test point, thus making available an output composite of the combined signaling for providing a feedback signal 140 to marker generator 200. The outputs of each of the QAM multiplexers are modulated to be allocated to a particular frequency band (e.g. of 6 MHz bandwidth in the United States but may be different in other countries) and are independently connected by plural connections 115 to signal combiner 120. These frequency bands will mostly be functionally contiguous (e.g. little information is contained in the "toes" of the bands where they may, in theory, overlap. As shown at 105 of FIG. 1B) except where certain other frequency bands falling within the overall signal spectrum that can be carried by the cable telecommunication system are allocated to particular purposes such as emergency warning communications. The output of the signal combiner 120 is then fed to a laser 150 which produces a broad band optical signal that is transmitted over fiber optic link 160 to fiber node 170 where the signal is converted to an electrical signal for distribution over shielded cables 180 to subscribers. It is shielding flaws 190 in cables 180 that the invention is directed to detecting using marker detector 300.

In accordance with the invention, at the head end 130 of the cable telecommunication system 100, a marker signal source 200 is provided which is controllable in regard to the nature of the marker signal that is to be generated and which also receives feedback 140 from signal combiner 120 to control the amplitude of the marker signal so that avoidance of any perceptible interference with other signals can be guaranteed, as will be described in greater detail below. The output of the marker signal generator is also supplied as an input to combiner 120 which thus outputs a combined signal comprising the data in all of the frequency bands allocated to the data sources 110 such as the exemplary QAM multiplexes discussed above.

Figure 2:
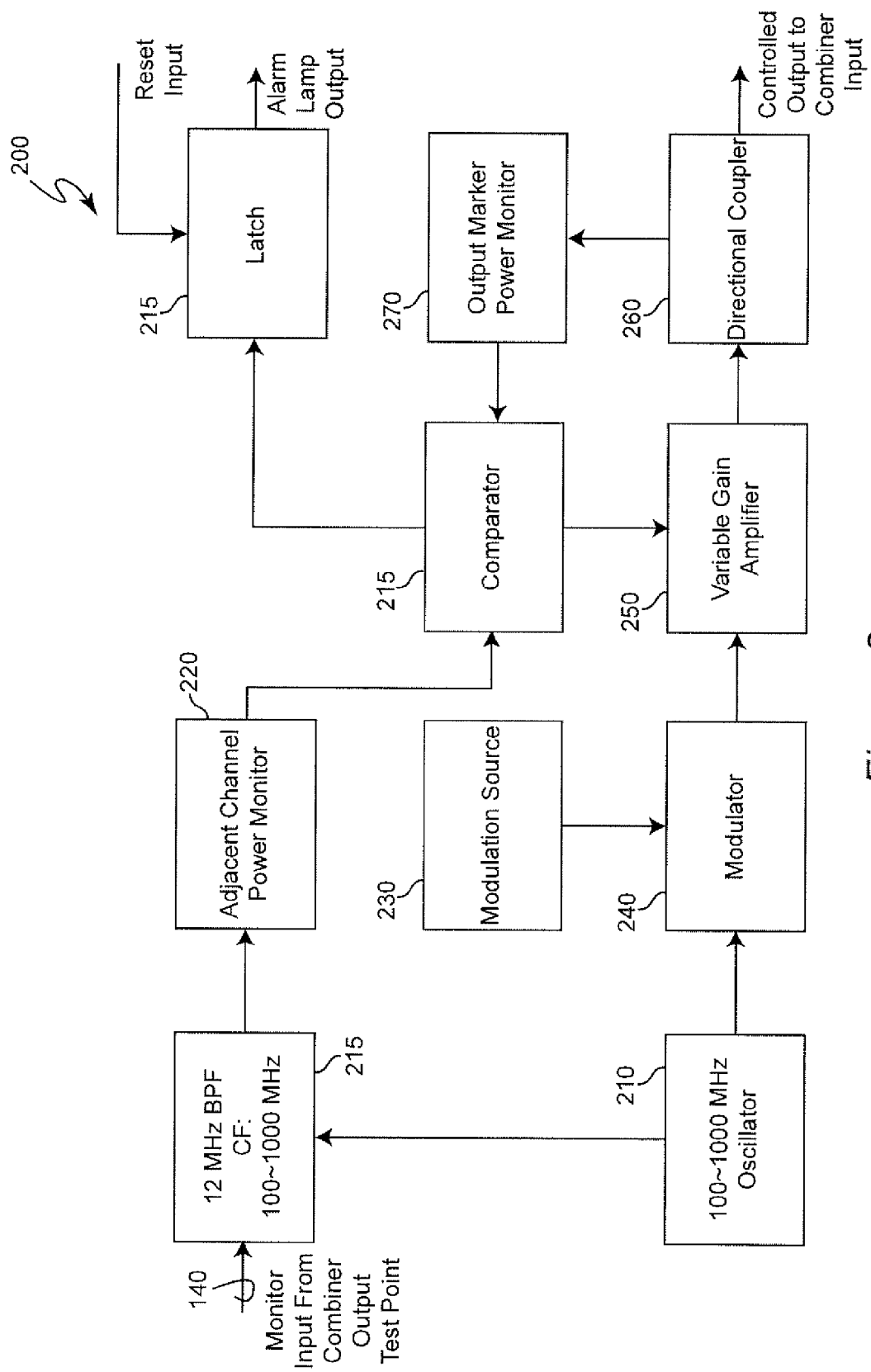
FIG. 2 is a high-level block diagram of the marker signal source in accordance with the invention.

Referring now to FIG. 2, the architecture of the marker generator will be discussed in detail. A tunable oscillator 210 provides a carrier signal for the marker (e.g. a marker carrier signal) and is set, in accordance with the invention, of a frequency, if (FIG. 1B), which is at the common boundary of two consecutively located and contiguous frequency bands, A, corresponding to two respective QAM multiplexed signals. The oscillator output signal or the frequency control information therefor is connected to a QAM band width band pass filter (e.g. 12 MHz in the United States, as noted above) 215 such that the center of the pass band of the filter is the same frequency as the frequency to which oscillator 210 has been set and at which frequency it is operating. It should be noted that it is not necessary to use a single QAM bandwidth filter as the same effect can be realized with two half-QAM bandwidth (e.g. 6 MHz) filter devices, each tuned to a center frequency ($f_1$, $f_2$ in FIG. 1B) of the oscillator 210 frequency, plus or minus one-half of the specified QAM bandwidth allocation. Thus, the single or combined band pass filter will pass the signal of two consecutively positioned frequency bands corresponding to two QAM multiplexes in the output of combiner 120 which is fed back to the filter, as illustrated at 140 in both FIGS. 1 and 2. While the frequency bands chosen are not important to the practice of the invention in accordance with its basic principles, it is considered generally preferable to choose a pair of frequency bands which are at relatively lower frequencies in the spectrum of the combiner output. The output of band pass filter 215 is then fed to a power monitor 220 to evaluate the power of each of the two adjacent/consecutively located frequency bands of two respective QAM multiplexes. The power of the frequency band containing the lower power is then communicated to comparator 280 as will be discussed in greater detail below.

The output of oscillator 210 is also input to a modulator 240 which also receives a modulation signal from a modulation source 230. The output of modulation source 230 need be nothing more than a sine wave of known frequency but may advantageously be made more complex by varying the frequency, adding digital coding (e.g. to contain a data payload or the like, singly or in combination. In some cases, an increased degree of complexity of the modulation signal may assist in unambiguous detection and identification of the marker amid significantly higher power levels of QAM signals which, as alluded to above, statistically resemble broadband noise. Additional coding can provide part or all of such additional complexity and provide a conduit for other information to detector 300 for calibration, scaling or any and all other purposes which may be deemed desirable for control or operation of the invention, some of which will be discussed in greater detail below while others will become apparent to those skilled in the art through experience in using the invention.

The output 245 of modulator 240 is preferably a double sideband, suppressed carrier signal. That is, the modulation performed by modulator 240 produces two side band frequencies separated from the carrier frequency of oscillator 210 by the frequency of the modulation signal from modulation source 230 indicated at D of FIG. 1B. The carrier frequency is of no further use and should preferably be suppressed to avoid being a potential source of interference. Thus, the remaining sidebands which will constitute the marker signal are placed within the consecutively located frequency bands, A, allocated to the two QAM multiplexes as discussed above where they could be a source of interference unless maintained at relatively low power; the reduced power level being indicated at C of FIG. 1B. It should also be appreciated that, by virtue of the above arrangement, the sidebands also are preferably placed in the fringes (indicated at B of FIG. 1B) of the frequency bands of the two consecutively located frequency bands allocated to the two QAM multiplexes where they are less likely to cause perceptible interference and may generally be somewhat more readily detectable. Sideband separation, D, and other unique signal traits resulting from the modulation source 230 acting on the modulator 240 provides the ability to unambiguously identify the emitted signal. This ability to unambiguously identify the marker signal is particularly important and useful to distinguish one cable telecommunication system from another where two or more such systems may have portions thereof installed within the same geographical area.

The power of the marker signal is controlled by variable gain amplifier 250, the output of which is provided to a directional coupler 260; through or low loss output of which forms the output of the marker signal source 200. The directional or high loss output is fed to a power monitor 270; an output of which also supplies an input to comparator 280 to be compared to the power of the less powerful of two consecutively located frequency bands allocated to two QAM multiplexes as discussed above. Responsive to these inputs, comparator 280 provides an output to control the gain applied to the marker signal 245 by variable gain amplifier 250 to keep the power of the marker signal lower than the lower powered of the two QAM multiplexes outputs by an amount which has been, for example, empirically determined to avoid any perceptible interference with the QAM signal (−30 dB is generally sufficient with current signaling practices and technology).

While not important to the practice of the invention in accordance with its basic principles, it is preferred to also provide logic or circuitry in comparator 280 to detect when control of marker signal power may be lost or cannot be kept at a non-interfering power level or possibly when marker signal power is of a level that would severely compromise the ability to detect a shielding flaw as might occur if the power of the signal from one of the pair of QAM multiplexes dropped to a very low level. This signal is provided to a latch 290 to control an alarm such as an indicator lamp, possibly in combination with a concurrent suspension of generation or injection of marker signals into the combiner 120, until reset upon correction of the condition that caused the loss of marker power control or potential interference. As a practical matter for the operator of a cable telecommunication system, it is very important to avoid interference with the signal distributed to subscribers both as a matter of customer satisfaction with the quality of delivered signals but also to avoid generation of service work orders in response to service complaints or incorrect prioritizing of maintenance work orders based on excessively high marker signal power causing shielding flaw severity to be erroneously indicated. It is precisely this strong and multi-faceted requirement for scrupulous avoidance of interference which has required the dedication of valuable bandwidth to shielding flaw detection in (otherwise) QAM environments in previously known systems; the avoidance of a requirement for which is a major meritorious effect of the present invention including provision of a variable power marker signal that can be kept at a non-interfering power level. By the same token, the invention assures that the maximum marker signal power level that does not cause perceptible interference is provided to optimize and optimally facilitate the detection of shielding flaws with relatively simple and small mobile/portable instruments.

Figure 3:
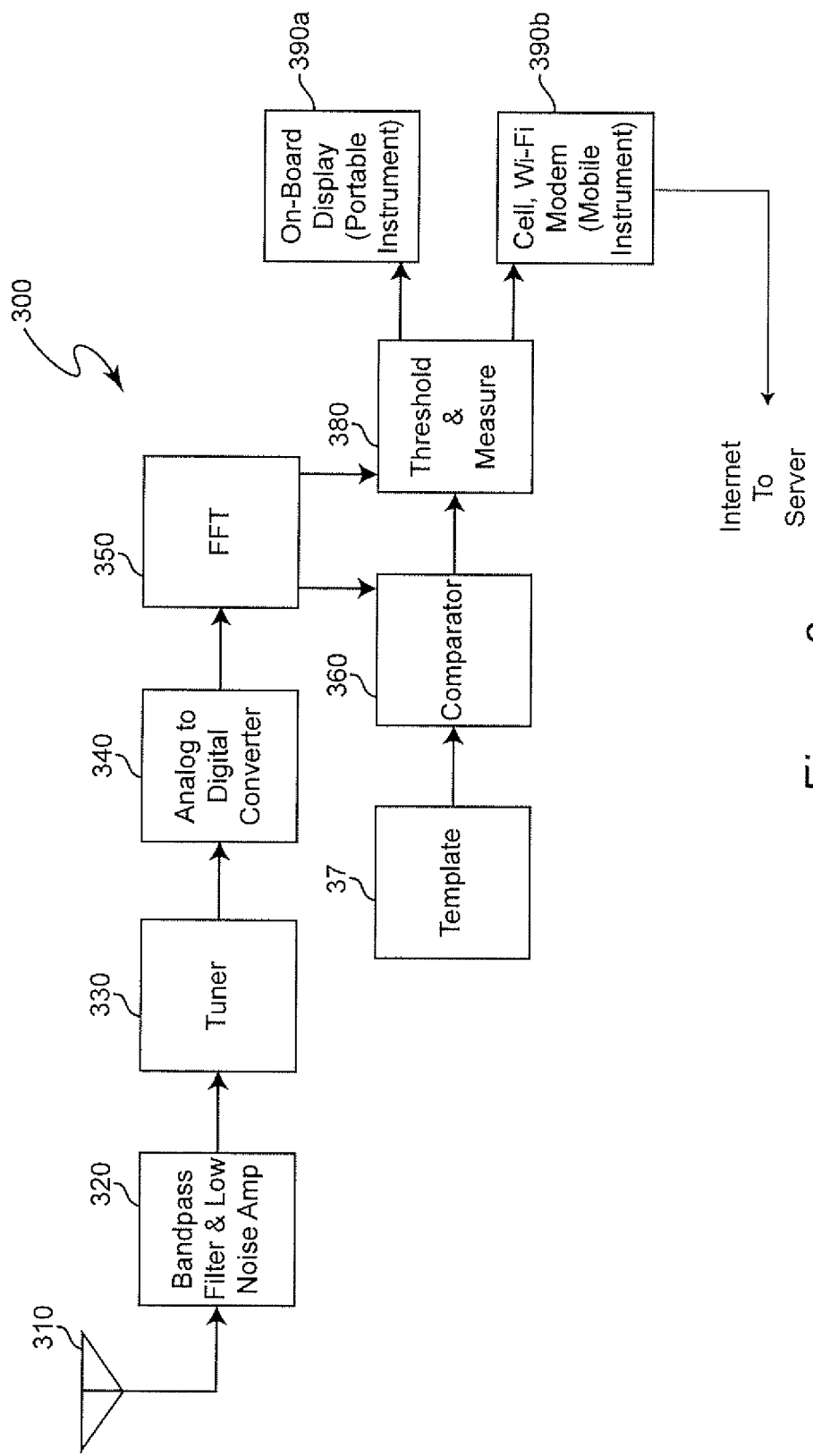
FIG. 3 is a high-level block diagram of the marker signal receiver in accordance with the invention.

Referring now to FIG. 3, a receiver/detector in accordance with the present invention will now be discussed. As alluded to above, two different types of instruments are preferably used in different phases of shielding flaw detection: a receiver in a mobile vehicle that can detect and report a possible egress signal from shielding flaw (and an indication of its location and relative severity) and a portable instrument to further localize and locate the shielding flaw for conducting a repair and confirming efficacy of the repair made. Both types of instruments have the same architecture as depicted in FIG. 3 but will differ in the ultimate output structure 390a and/or 390b. By the same token, a single instrument could be made to serve both functions but such an embodiment is not preferred since a larger number of mobile instruments will ensure that far more of the area of cable telecommunication system 100 is examined for shielding flaws when a large population of service vehicles are provided with the mobile instrument and the communications facilities of the mobile instrument are of significant size and weight and would encumber optimal use of the portable instrument and are unnecessary in the locating of shielding flaws.

Background noise, including broadcast signals possibly including an egress signal from a cable telecommunication system, are received at antenna 31 and are bandpass filtered and amplified using low noise amplifier 320. The resulting signal is fed to a tuner 330 tuned to the center frequency of the marker source (e.g. the carrier frequency at which oscillator 110 is operating). Thus all frequencies are removed except those within a small bandwidth surrounding the frequency of the carrier signal (which has preferably been suppressed as alluded to above). Thus, the only frequencies which remain are the side band marker signals and the small amount of power in the fringes of the two consecutively located QAM signals. These remaining signals are converted from analog form to digital form at A/D converter 340 and the frequency spectrum is calculated at 350, using a fast Fourier transform (FFT) or other technique such as a spectrum analyzer to allow extraction of the sideband signals. The magnitude of the frequency spectrum is then supplied to a comparator 360 where they are compared with one or more spectrum templates corresponding to the spectrum (e.g. frequency and separation, D) of (unique) modulation signal(s) that have been provided in response to modulation source 230, as discussed above. Such comparison with templates can also reveal any coding (e.g. sideband separation or amplitude) or other signal complexity applied to the marker signal. It should be noted that the matching of templates (e.g. by cross-correlation) provides for discrimination between different cable telecommunication systems which are in close proximity to each other. Increased complexity of the marker signal also may provide increased robustness and facility of marker signal and corresponding shielding flaw detection. Coding of the marker signal (which also provides increased marker signal complexity) might be used to remotely control any aspect of the operation of receiver 300 such as switching from one carrier signal frequency to another or switching between different marker signal modulation schemes or modes to assure synchronization of operation of the transmitter 200 and receiver 300 of the invention which can provide further increased levels of robustness in confirming and identifying egress signals. When the degree of favorable comparison between template 390 and frequency spectrum 350 exceeds a predetermined threshold, then a measurement of the power present in the frequency spectrum 350 unique to the sidebands of the marker is performed. The peak, over a short time, of the sideband-unique power measurement is determined and communicated to the operator, typically using method 390a or 390b. In the case of the mobile instrument using method/instrument 390b, the location of the peak is also recorded and communicated. The output of threshold and measurement logic 380 is either fed to a wireless communication arrangement 390b or a portable computer for later downloading at a central facility (for a mobile type of instrument) or to an on-board display (for a portable instrument) such that the user can follow increasing signal strength to the location of a shielding flaw. The information communicated to the operator may then be used to indicate the severity and location of the detected leak. One important possible and preferred use of coding of the modulation is to provide an indication of transmitted marker signal power to the receiver for proper setting of a threshold for detection and scaling of egress signal power measurement by threshold and measurement logic 380 in view of the variable marker signal power level required to guarantee freedom from perceptible interference with the signal distributed by the cable telecommunication system.

In view of the foregoing, it is seen that the invention provides robust shielding flaw detection in a QAM environment that does not require a dedicated spectrum band or frequency in order to avoid interference with signals distributed by a cable telecommunication system by virtue of the marker signal power being kept below a level which can cause perceptible interference with a QAM signal in bands adjacent to the marker signal carrier frequency. The invention also allows maximum marker signal power to be utilized relative to QAM signal power while scrupulously avoiding possible interference with the QAM signal, also by virtue of monitoring the power of the QAM signals in the frequency bands adjacent to the marker carrier signal frequency and adjusting the marker signal power accordingly. The invention also allows unambiguous marker signal identification by virtue of template matching, possibly augmented by coding to assure synchronization of the operating mode and marker signal characteristics between the transmitter and receiver of the system in accordance with the invention. The robustness of marker signal detection and identification amidst high levels of noise and noise-like signals can be enhanced by virtue of the invention allowing for an arbitrary degree of increased marker signal complexity. Further, the system of the invention can be used, in accordance with its basic principles in combination with legacy analog signals or foreseeable all-digital systems and other modulation techniques or any combination thereof.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for detection and measurement of the severity of shielding flaws in a cable telecommunication system, said method comprising steps of
   generating at least two unique signals, each said unique signal being controlled in frequency and amplitude to avoid interference with payload signals normally distributed by said cable telecommunication system,
   combining said at least two unique signals with said coexisting payload signals to form a combined signal,
   transmitting said combined signal through said cable telecommunication system,
   receiving a signal through an antenna, and
   detecting said at least one of said at least two unique signals in said signal received through said antenna.

2. The method as recited in claim 1, wherein said detecting step is performed by matching a portion of a spectrum of a received signal to a spectral template.

3. The method as recited in claim 2, wherein said detecting step includes a step of applying a threshold to the degree of favorable comparison between said spectrum of a portion of said received signal and said template.

4. The method as recited in claim 2, including a further step of measuring a magnitude of a detected leak.

5. The method as recited in claim 4, including the further step of determining cable shielding flaw severity.

6. The method as recited in claim 1, wherein said detecting step is performed by matching a portion of a spectrum to a spectrum of said marker signal by cross-correlation.

7. The method as recited in claim 6, wherein said detecting step includes a step of applying a threshold to the degree of favorable comparison between said spectrum of a portion of said received signal and said template.

8. The method as recited in claim 6, including a further step of measuring a magnitude of a detected leak.

9. The method as recited in claim 8, including the further step of determining cable shielding flaw severity.

10. The method as recited in claim 1, wherein said payload signals are quadrature amplitude modulated signals.

11. The method as recited in claim 1, wherein said at least two unique signals are located at frequencies in fringes of two consecutively located Quadrature Amplitude Modulated frequency bands.

12. The method as recited in claim 1, wherein said step of generating two unique signals includes further steps of generating a marker carrier signal at a frequency in fringes of or between boundaries of two consecutively located frequency bands, and modulating said marker carrier signal to produce two sideband signals as a marker signal.

13. The method as recited in claim 12, wherein said marker carrier signal frequency is located at a frequency midway between said two consecutively located frequency bands.

14. The method as recited in claim 1, wherein said two unique signals of said marker signal are located in a fringe of at least one of said two consecutive frequency bands.

15. The method as recited in claim 14, wherein fringes of said two consecutive frequency bands overlap.

16. The method as recited in claim 1, further including steps of monitoring power of two consecutively located frequency bands, and regulating power of said at least two unique signals in accordance with said power of said two consecutively located frequency bands monitored by said monitoring step.

* * * * *

UNITED STATES PATENT AND TRADEMARK OFFICE
CERTIFICATE OF CORRECTION

| | | |
|---|---|---|
| PATENT NO. | : 8,749,248 B2 | Page 1 of 1 |
| APPLICATION NO. | : 13/080715 | |
| DATED | : June 10, 2014 | |
| INVENTOR(S) | : John J. Murphy and Dennis A. Zimmerman | |

It is certified that error appears in the above-identified patent and that said Letters Patent is hereby corrected as shown below:

Title Page

On page 1, (73) Assignee, should read as follows:

(73) Assignee: ComSonics, Inc., Harrisonburg, VA (US)

Signed and Sealed this
Thirtieth Day of December, 2014

Michelle K. Lee
*Deputy Director of the United States Patent and Trademark Office*